United States Patent
Kim et al.

(10) Patent No.: US 9,075,273 B2
(45) Date of Patent: Jul. 7, 2015

(54) THIN FILM TRANSISTOR ARRAY PANEL AND MANUFACTURING METHOD THEREOF

(75) Inventors: Jae-Sung Kim, Suwon-si (KR); Hoon Kang, Suwon-si (KR); Jin-Young Choi, Incheon (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/360,386

(22) Filed: Jan. 27, 2012

(65) Prior Publication Data

US 2013/0075736 A1 Mar. 28, 2013

(30) Foreign Application Priority Data

Sep. 28, 2011 (KR) .................... 10-2011-0098334

(51) Int. Cl.
*H01L 27/12* (2006.01)
*G02F 1/1345* (2006.01)
*G02F 1/1362* (2006.01)
*G02F 1/1343* (2006.01)

(52) U.S. Cl.
CPC .......... *G02F 1/13458* (2013.01); *H01L 27/124* (2013.01); *G02F 1/136227* (2013.01); *G02F 2001/134372* (2013.01)

(58) Field of Classification Search
CPC ............................. H01L 21/77; H01L 27/1214
USPC ........ 257/59; 349/139–152; 438/30, 612, 613
See application file for complete search history.

(56) References Cited

U.S. PATENT DOCUMENTS 7,684,006 B2   3/2010 Jung
7,858,452 B2 * 12/2010 Park .............................. 438/149
2004/0257509 A1 * 12/2004 Lee et al. ....................... 349/139
2006/0001803 A1 *  1/2006 Park .............................. 349/113
2008/0087904 A1 *  4/2008 Heo et al. ........................ 257/89
2009/0091675 A1 *  4/2009 Park et al. ........................ 349/43
2009/0167975 A1 *  7/2009 Lee et al. ......................... 349/43
2010/0044707 A1 *  2/2010 Kong et al. ...................... 257/57
2010/0127263 A1    5/2010 Lee et al.
2010/0128192 A1 *  5/2010 Kim et al. ....................... 349/46

FOREIGN PATENT DOCUMENTS

| KR | 1020030046102 A | 6/2003 |
| KR | 1020060017162 A | 2/2006 |
| KR | 1020060132167 A | 12/2006 |
| KR | 1020080038599 A | 5/2008 |
| KR | 10-0850585 B | 7/2008 |
| KR | 1020080069395 A | 7/2008 |
| KR | 1020100066753 A | 6/2010 |

* cited by examiner

*Primary Examiner* — Cheung Lee
*Assistant Examiner* — Stephen Bradley
(74) *Attorney, Agent, or Firm* — Innovation Counsel LLP

(57) ABSTRACT

A thin film transistor array panel includes: an substrate; a gate line and a gate pad portion disposed on the substrate; a gate insulating layer disposed on the gate line and the gate pad portion; a data line and a data pad portion disposed on the gate insulating layer; a gate assistance pad portion disposed at a position corresponding to the gate pad portion; a first insulating layer disposed on the data line and removed at the gate pad portion and the data pad portion; a first field generating electrode disposed on the first insulating layer; a second insulating layer disposed on the first field generating electrode and removed at the gate pad portion and the data pad portion; and a second field generating electrode disposed on the second insulating layer. The assistance gate pad portion and the gate insulating layer include a contact hole exposing the gate pad portion.

18 Claims, 37 Drawing Sheets

THIN FILM TRANSISTOR ARRAY PANEL AND MANUFACTURING METHOD THEREOF

CROSS-REFERENCE TO RELATED APPLICATION

This application claims priority to and the benefit of Korean Patent Application No. 10-2011-0098334 filed in the Korean Intellectual Property Office on Sep. 28, 2011, the entire contents of which are incorporated herein by reference.

BACKGROUND OF THE INVENTION (a) Field of the Invention

The present invention relates to a thin film transistor array panel and a manufacturing method thereof.

(b) Description of the Related Art

Among display panels, liquid crystal displays (LCD) are a type of flat panel display that is currently being widely used. LCDs include two display panels on which field generating electrodes such as a pixel electrode and a common electrode, etc., are formed, and a liquid crystal (LC) layer disposed therebetween. To display an image on an LCD display a voltage is applied to the field-generating electrodes to generate an electric field across the LC layer. The voltage applied to the LC layer determines the orientation of LC molecules therein to adjust polarization of incident light. In the liquid crystal display, the pixel electrode and the common electrode that generate the electric field across the liquid crystal layer may be formed on a thin film transistor array panel.

In one aspect of a liquid crystal display, a pad portion connects a driving circuit on the thin film transistor array panel. The driving circuit is used apply a gate voltage and a data voltage to the field generating electrode of the liquid crystal display. In a case in which the thickness of a passivation layer on the thin film transistor array panel is excessive, the height of a contact hole that exposes the pad portion is increased. As a result, a connecting member connecting the driving circuit and pad portion may easily become disconnected. Furthermore, in the case of the gate pad portion, a gate insulating layer is also disposed on the gate pad portion, and thus the height of the contact hole that exposes the gate pad portion is further increased.

In particular, when forming two field generating electrodes in the thin film transistor array panel, and when using an organic insulator as a passivation layer, the height of the contact hole that exposes the pad portion is further increased.

When manufacturing a liquid crystal display, a photolithography process is used for patterning a thin film layer of the thin film transistor; however the manufacturing cost is increased as the number of photomasks for the photolithography process is increased.

The above information disclosed in this Background section is only for enhancement of understanding of the background and therefore it may contain information that does not form the prior art that is already known to a person of ordinary skill in the art.

SUMMARY OF THE INVENTION

A thin film transistor array panel is provided in which the height difference between a pad portion of a signal line and a connecting member is reduced to easily connect a pad portion and a connecting member. A manufacturing method thereof that prevents an increase of the manufacturing cost thereof is also provided.

A thin film transistor array panel includes: an insulation substrate; a gate line and a gate pad portion disposed on the insulation substrate; a gate insulating layer disposed on the gate line and the gate pad portion; a data line and a data pad portion disposed on the gate insulating layer; a gate assistance pad portion disposed at a position corresponding to the gate pad portion; a first insulating layer disposed on the data line and removed at the gate pad portion and the data pad portion; a first field generating electrode disposed on the first insulating layer; a second insulating layer disposed on the first field generating electrode and removed at the gate pad portion and the data pad portion; and a second field generating electrode disposed on the second insulating layer, wherein the assistance gate pad portion and the gate insulating layer include a contact hole exposing the gate pad portion.

A connecting member covering the contact hole may be further included, and the connecting member may be made with the same layer as at least one of the first field generating electrode and the second field generating electrode.

The gate insulating layer may be disposed between the gate pad portion and the assistance gate pad portion.

The assistance gate pad portion may be made of the same layer as the data line.

There may be one or more contact holes exposing the gate pad portion through the assistance gate pad portion and the gate insulating layer.

A shape of the contact hole in a plan view may be polygonal, circular, or oval.

An assistance data pad portion disposed at a position corresponding to the data pad portion may be further included.

The gate insulating layer may be disposed between the data pad portion and the assistance data pad portion.

The assistance data pad portion and the gate line may be made with the same material.

One of the first field generating electrode and the second field generating electrode may have a planar shape, and the other may include a branch electrode.

The first insulating layer may include an organic insulator, and a surface thereof is flat.

A manufacturing method of a thin film transistor array panel includes: forming a gate line and a gate pad portion on an insulation substrate; depositing a gate insulating layer on the gate line and the gate pad portion; forming a data line, a data pad portion, and a gate assistance pad portion having a through hole on the gate insulating layer; forming a first insulating layer removed at the gate pad portion and the data pad portion on the data line, and a contact hole aligned with the through hole and exposing the gate pad portion in the gate insulating layer; forming a first field generating electrode on the first insulating layer; forming a second insulating layer removed at the gate pad portion and the data pad portion on the first field generating electrode; and forming a second field generating electrode on the second insulating layer.

The method may further include forming a connecting member covering the contact hole along with one of the forming of the first field generating electrode and the forming of the second field generating electrode.

The gate insulating layer may be etched by using the assistance gate pad portion as an etching mask in the forming of the contact hole.

The forming of the connecting member may include: depositing a conductive layer forming the first field generating electrode or the second field generating electrode on the assistance gate pad portion; forming a photosensitive film pattern disposed on the conductive layer and completely covering the assistance gate pad portion; and etching the conductive layer by using the photosensitive film pattern as the etching mask.

The method may further include simultaneously forming an assistance data pad portion disposed at a position corresponding to the data pad portion along with the forming of the gate line and the gate pad portion.

As described above, the thick organic insulator is not disposed at the pad portion of the thin film transistor array panel so as to decrease the difference between the pad portion of the signal line and the connecting member such that the pad portion and the connecting member may be smoothly connected. Also, the additional photomask is not needed, thereby preventing an increasing of the manufacturing cost.

DETAILED DESCRIPTION OF THE EMBODIMENTS

Figure 1:
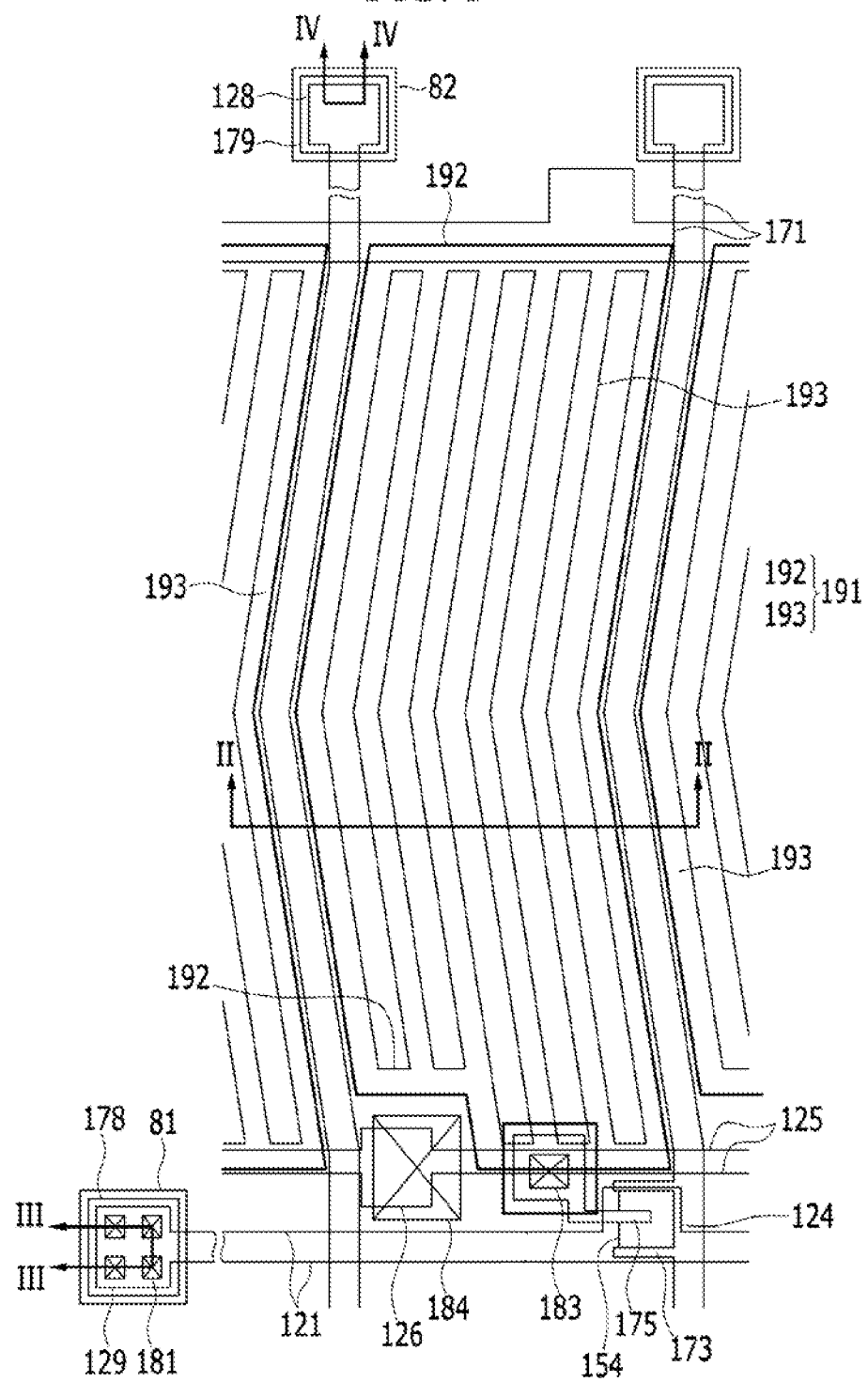
FIG. 1 is a layout view of a thin film transistor array panel according to an exemplary embodiment.

Example embodiments will be described more fully hereinafter with reference to the accompanying drawings. As those skilled in the art would realize, the described embodiments may be modified in various different ways, all without departing from the spirit or scope of the present disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element, or intervening elements may also be present. In contrast, when an element is referred to as being "directly on" another element, there are no intervening elements present.

Figure 2:
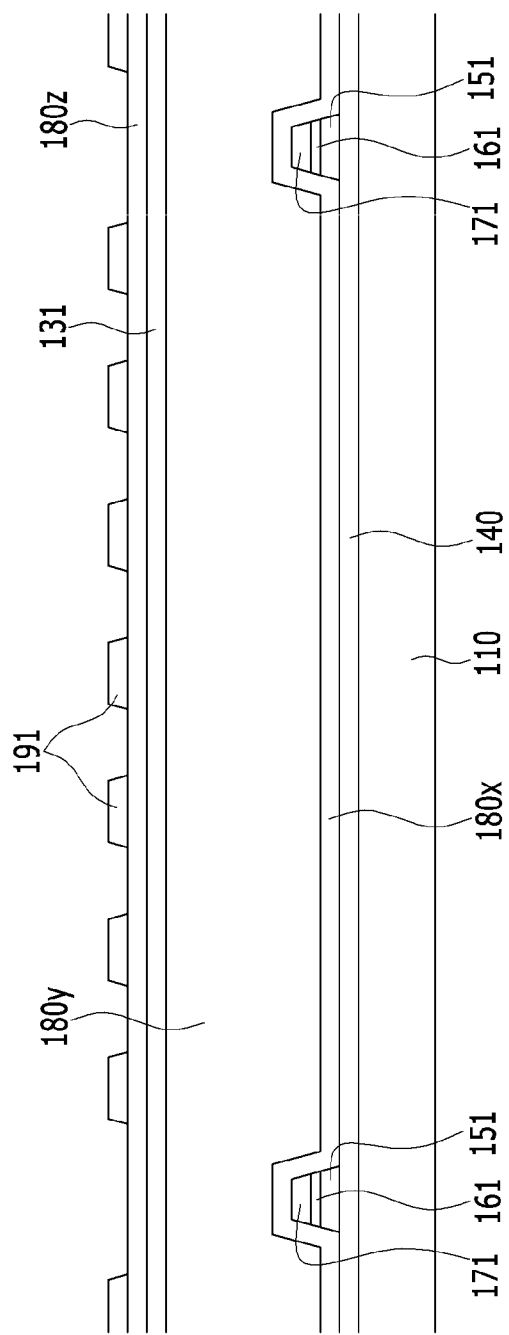
FIG. 2 is a cross-sectional view of the thin film transistor array panel taken along the line II-II of FIG. 1.
Figure 3:
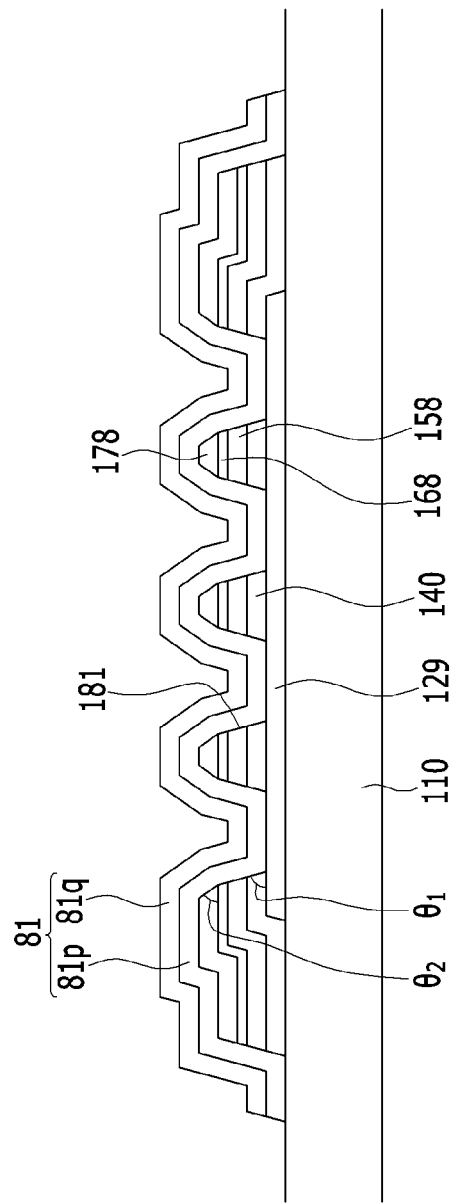
FIG. 3 is a cross-sectional view of the thin film transistor array panel taken along the line III-III of FIG. 1.
Figure 4:
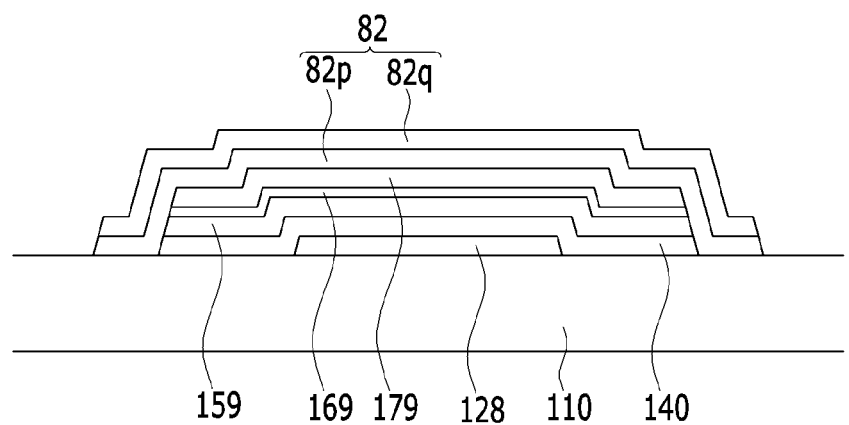
FIG. 4 is a cross-sectional view of the thin film transistor array panel taken along the line IV-IV of FIG. 1.

Firstly, a thin film transistor array panel according to an exemplary embodiment will be described with reference to FIG. 1 to FIG. 4. FIG. 1 is a layout view of a thin film transistor array panel according to an exemplary embodiment, FIG. 2 is a cross-sectional view of the thin film transistor array panel taken along the line II-II of FIG. 1, FIG. 3 is a cross-sectional view of the thin film transistor array panel taken along the line III-III of FIG. 1, and FIG. 4 is a cross-sectional view of the thin film transistor array panel taken along the line IV-IV of FIG. 1.

Referring to FIG. 1 to FIG. 4, a plurality of gate conductors including a plurality of gate lines 121, a plurality of common voltage lines 125, and a plurality of assistance data pad portions 128 are formed on an insulation substrate 110.

Each of the gate lines 121 include a plurality of gate electrodes 124 that protrude upward from the gate line 121, and a gate pad portion 129 (FIG. 3) having a wide area for connecting with other layers or external driving circuits. A gate driving circuit (not shown) for generating a gate signal may be mounted on a flexible printed circuit film (not shown), attached to the substrate 110, or mounted directly on the substrate 110, or may be integrated with the substrate 110.

The common voltage line 125 transmits a predetermined voltage such as a common voltage Vcom. The common voltage line 125 extends in an almost transverse direction, and may be substantially parallel to the gate line 121. Each common voltage line 125 may include a plurality of expansions 126.

The assistance data pad portion 128 is disposed under a data pad portion 179 that will be described later. The assistance data pad portion 128 is disposed under the data pad portion 179, thereby increasing the height of the data pad portion 179 (relative to substrate 110). The assistance data pad portion 128 may be omitted.

The gate conductors 121, 125, and 128 may be a single layer or a multilayer including at least two conductive layers.

A gate insulating layer 140 is formed on the gate conductors 121, 125, and 128. The gate insulating layer 140 may be made of an inorganic insulator such as silicon nitride (SiNx) or silicon oxide (SiOx).

The gate insulating layer 140 includes a first contact hole 181 exposing the gate pad portion 129. There may be one or more first contact holes 181, and the shape thereof in a planar view (as shown in FIG. 1) may be a polygon such as a quadrangle, a circular shape, or an oval shape.

A plurality of semiconductors 151 are formed on the gate insulating layer 140. The semiconductor 151 may have an expansion 154 extending toward the gate electrode 124. An ohmic contact 161 is disposed on the semiconductor 151, and the ohmic contact may be omitted.

A data conductor including a plurality of data lines 171, a plurality of drain electrodes 175, and a plurality of assistance gate pad portions 178 is formed on the ohmic contact.

The data line 171 transmits a data signal and extends in a longitudinal direction thereby intersecting the gate line 121 and the common voltage line 125. Each data line 171 includes a plurality of source electrodes 173 extending toward the gate electrodes 124, and a data pad portion 179 that has a wide area for connection with a different layer or an external driving circuit. The data driving circuit (not shown) that generates the data signal is disposed on a flexible printed circuit film (not shown) that is attached to the substrate 110, or directly disposed on the substrate 110.

The drain electrode 175 includes one end that has a bar shape and the other having a wide area that faces the source electrode 173 with respect to the gate electrode 124.

The assistance gate pad portion 178 is disposed on the gate pad portion 129, and a portion of the assistance gate pad portion 178 corresponding to the first contact hole 181 formed in the gate insulating layer 140 is removed.

A first semiconductor 158, formed in the same layer as semiconductors 151 and expansion 154, and a first contact assistant 168 are disposed under the assistance gate pad portion 178. A portion corresponding to the first contact hole 181 formed in the gate insulating layer 140 among the first semiconductor 158 and the first contact assistants 168 is removed.

In this way, the first contact hole 181 is formed in the gate insulating layer 140, the first semiconductor 158, and the first contact assistants 168 and assistance gate pad portion 178. The gate pad portion 129 is connected to a connecting member, that will be described later, through the first contact hole 181 formed in the gate insulating layer 140, the first semiconductor 158, and the first contact assistants 168 and assistance gate pad portion 178.

The data conductors 171, 175, and 178 may be a single layer or a multilayer including at least two conductive layers.

A second semiconductor 159 (FIG. 4), formed in the same layer as semiconductors 151 and expansion 154, and the second contact assistants 169 are disposed under the data pad portion 179.

The gate electrode 124, the source electrode 173, and the drain electrode 175 form a thin film transistor (TFT) as a switching element along with the expansion 154 of the semiconductor 151. The semiconductor 151 may have almost the same shape in a planar view as the data conductors 171, 175, and 178, except for the channel of the thin film transistor (expansion 154).

The first passivation layer 180x is positioned on the data line 171, the drain electrode 175, and the exposed expansion 154 of the semiconductor 151, and the first passivation layer 180x may be made of, for example, an organic insulating material or an inorganic insulating material.

The first passivation layer 180x is removed in a region where the gate pad portion 129 and the data pad portion 179 are disposed.

The second passivation layer 180y is positioned on the first passivation layer 180x. The second passivation layer 180y may include an organic material and covers the data line 171. The surface of the second passivation layer 180y may be almost flat.

Although not shown, in a thin film transistor array panel according to another exemplary embodiment, the second passivation layer 180y may be a color filter, and in this case, a layer disposed on the second passivation layer 180y may be further included. For example, an overcoat (capping layer) disposed on the color filter to prevent a pigment of the color filter from flowing into the liquid crystal layer may be further included, and the overcoat may be made of an insulating material such as silicon nitride (SiNx).

The second passivation layer 180y is removed at a region where the gate pad portion 129 and the data pad portion 179 are disposed.

The first passivation layer 180x, the second passivation layer 180y, and the gate insulating layer 140 have the second contact hole 184 exposing a portion of the common voltage line 125.

A common electrode 131 is formed on the second passivation layer 180y. The common electrode 131 may be made of a transparent conductive material such as, for example, ITO or IZO. The common electrode 131 is electrically connected to the common voltage line 125 through the contact hole 184 thereby receiving a predetermined voltage, such as a common voltage Vcom, from the common voltage line 125. The common electrode 131 in the present exemplary embodiment has a planar shape such that it may be formed with one plate on the entire surface of the substrate 110.

The third passivation layer 180z is formed on the common electrode 131, and a pixel electrode 191 is formed thereon. The pixel electrode 191 may be made of the transparent conductive material such as, for example, ITO or IZO.

The first passivation layer 180x, the second passivation layer 180y, and the third passivation layer 180z have a plurality of third contact holes 183 exposing a portion of the drain electrode 175. The pixel electrode 191 is electrically connected to the drain electrode 175 through the third contact hole 183 thereby receiving the data voltage. The pixel electrode 191 includes a plurality of branch electrodes 193 almost parallel to each other and separated from each other, and lower and upper transverse portions 192 connecting upper and lower ends of the branch electrode 193. The branch electrode 193 of the pixel electrode 191 may be bent at an angle with respect to the data line 171.

The pixel electrode 191 applied with the data voltage along with the common electrode 131 applied with the common voltage generates an electric field to a liquid crystal layer (not shown).

In the case of the thin film transistor array panel according to the present exemplary embodiment, the common electrode 131 is disposed under the third passivation layer 180z and the pixel electrode 191 is disposed on the third passivation layer 180z, however in the case of a thin film transistor array panel according to another exemplary embodiment, the pixel electrode 191 may be disposed under the third passivation layer 180z and the common electrode 131 may be disposed on the third passivation layer 180z. Also, one of the common electrode 131 and the pixel electrode 191 may include a branch electrode and the other may have a planar shape.

That is, all characteristics of the thin film transistor array panel according to an exemplary embodiment may be applied to all cases in which the common electrode and the pixel electrode, as two field generating electrodes, are disposed on the thin film transistor array panel.

The first connecting member 81 is disposed on the assistance gate pad portion 178 (which is disposed on the gate pad portion 129), and the second connecting member 82 is disposed on the data pad portion 179. The first connecting member 81 is connected to the gate pad portion 129 through the first contact hole 181 formed at the gate insulating layer 140, the first semiconductor 158, the first contact assistants 168, and the assistance gate pad portion 178. The second connecting member 82 covers the data pad portion 179 and may have a wider area than the data pad portion 179. The first connecting member 81 and the second connecting member 82 are simultaneously formed with the same layer.

The first connecting member 81 and the second connecting member 82 may include lower layers 81p and 82p and upper layers 81q and 82q, the lower layers 81p and 82p may be formed with the same layer as the common electrode 131 (when common electrode 131 is disposed as the lower electrode among the field generating electrodes), and the upper layers 81q and 82q may be formed with the same layer as the pixel electrode 191 (when pixel electrode 191 is as the upper electrode among the field generating electrodes). In a case of the thin film transistor array panel according to another exemplary embodiment, the lower layers 81p and 82p of the first connecting member 81 and the second connecting member 82 may be formed with the same layer as the pixel electrode 191 (when disposed as the lower field generating electrode), and the upper layers 81q and 82q of the first connecting member 81 and the second connecting member 82 may be formed with the same layer as the common electrode 131 (when disposed as the upper field generating electrode). That is, the lower layers 81p and 82p of the first connecting member 81 and the second connecting member 82 may be formed with the same layer as the field generating electrode disposed in the lower position among the field generating electrodes, and the upper layers 81q and 82q of the first connecting member 81 and the second connecting member 82 may be formed with the same layer as the other field generating electrode disposed in the upper position among the field generating electrodes. However, the first connecting member 81 and the second connecting member 82 may be made of the same layer as one of the field generating electrodes 131 and 191.

A pad portion of the thin film transistor array panel according to the present exemplary embodiment will now be described in detail with reference to FIG. 3 and FIG. 4.

Referring to FIG. 3, the gate pad portion 129 is disposed on the substrate 110, and the gate insulating layer 140, the first semiconductor 158, the first contact assistants 168, and the assistance gate pad portion 178 are disposed on the gate pad portion 129.

The first contact hole 181, which exposes a portion of the gate pad portion 129, is formed through the gate insulating layer 140, the first semiconductor 158, the first contact assistants 168, and the assistance gate pad portion 178. There may be at least one first contact hole 181, and the shape thereof (in a planar view) may be a polygon such as a quadrangle, or it may have a circular or oval shape.

The first connecting member 81 is disposed on the gate pad portion 129.

The gate pad portion 129 is connected to the first connecting member 81 through the first contact hole 181 formed through the gate insulating layer 140, the first semiconductor 158, the first contact assistants 168, and the assistance gate pad portion 178.

The first connecting member 81 electrically connects the gate pad portion 129 to the outer driving circuit and covers the gate pad portion 129 for protection from corrosion.

As described above, the first contact hole 181 is formed through the gate insulating layer 140, the first semiconductor 158, the first contact assistants 168, and the assistance gate pad portion 178. Near the first contact hole 181 formed at the gate insulating layer 140, the first semiconductor 158, and the first contact assistants 168, a first taper angle θ1 between the gate insulating layer 140, the first semiconductor 158, and the first contact assistants 168 and the substrate 110 surface may be larger than a second taper angle θ2 between the assistance gate pad portion 178 and the substrate 110 surface near the first contact hole 181 formed at the assistance gate pad portion 178. This results in a difference according to etching speed, wherein the gate insulating layer 140 is generally etched by dry etching, and the data conductor like the assistance gate pad portion 178 is generally etched by wet etching. Also, when patterning the data conductor and the semiconductor layer disposed thereunder by using one photomask in the thin film transistor array panel, the data conductors are etched twice, such that they may have a taper angle different from the semiconductor layer disposed thereunder.

As described above, the first passivation layer 180x, the second passivation layer 180y, and the third passivation layer 180z disposed in the pixel area including the field generating electrodes 131 and 191 are all removed in the region where the gate pad portion 129 is formed. As a result, the height of the first contact hole 181 exposing the gate pad portion 129 is lowered, and thus disconnection of the first connecting member 81 formed on the first contact hole 181 may be prevented.

Referring to FIG. 4, the assistance data pad portion 128 is disposed on the substrate 110, the gate insulating layer 140 is disposed on the assistance data pad portion 128, and the second semiconductor 159 and the second contact assistants 169 are disposed thereon. The data pad portion 179 is disposed on the second contact assistants 169. However, in the case of the thin film transistor array panel according to another exemplary embodiment, the assistance data pad portion 128 may be omitted. The assistance data pad portion 128 increases the height of the data pad portion 179 disposed thereon, thereby increasing the contact characteristic with the outer driving circuit.

The second connecting member 82 is formed on the data pad portion 179. The second connecting member 82 covers the data pad portion 179 and may have a wider area than the data pad portion 179.

As described above, the first passivation layer 180x, the second passivation layer 180y, and the third passivation layer 180z disposed in the pixel area including the field generating electrodes 131 and 191 are all removed in the region where the data pad portion 179 is formed. As a result, the contact hole is formed at the passivation layers 180x, 180y, and 180z having the thick thickness such that the second connecting member 82 and the data pad portion 179 are not connected, and by the height of the contact hole according to the thickness of the passivation layer, disconnection of the second connecting member 82 may be prevented.

The second connecting member 82 electrically connects the data pad portion 179 to the outer driving circuit and covers the data pad portion 179 to protect it from corrosion.

The first connecting member 81 and the second connecting member 82 may include lower layers 81p and 82p and upper layers 81q and 82q, the lower layers 81p and 82p may be formed with the same layer as the common electrode 131 (when common electrode 131 is disposed as the lower electrode among the field generating electrodes,) and the upper layers 81q and 82q may be formed with the same layer as the pixel electrode 191 (when pixel electrode 191 is disposed as the upper electrode among the field generating electrodes). That is, the first connecting member 81 and the second connecting member 82 may be formed with the same layer as the field generating electrode 131 and 191 and may include the lower layer 81p and 82p made with the same layer as one layer of the field generating electrodes 131 and 191 and the upper layer 81q and 82q made with the same layer as the other layer of the field generating electrodes 131 and 191. However, the first connecting member 81 and the second connecting member 82 may alternatively be a single layer made of the same layer as one of the field generating electrodes 131 and 191.

In a case of the thin film transistor array panel according to another exemplary embodiment, the ohmic contact 161, the first contact assistants 168, and the second contact assistants 169 may be omitted.

In the case of the thin film transistor array panel according to the present exemplary embodiment, one of the two field generating electrodes 131 and 191 overlapping each other has the planar shape and the other has the branch shape, however the present disclosure may be applied to a thin film transistor array panel of all shapes in which one display panel has two field generating electrodes.

Next, a manufacturing method of a thin film transistor array panel according to an exemplary embodiment will be described with reference to FIG. 5 to FIG. 37 as well as FIG. 1. FIG. 5, FIG. 8, FIG. 11, FIG. 14, FIG. 17, FIG. 20, FIG. 23, FIG. 26, FIG. 29, FIG. 32, and FIG. 35 are cross-sectional views of the thin film transistor array panel taken along the line II-II of FIG. 1 in a manufacturing process according to a manufacturing method of a thin film transistor array panel according to an exemplary embodiment. FIG. 6, FIG. 9, FIG. 12, FIG. 15, FIG. 18, FIG. 21, FIG. 24, FIG. 27, FIG. 30, FIG. 33, and FIG. 36 are cross-sectional views of the thin film transistor array panel taken along the line III-III of FIG. 1 in a manufacturing process according to a manufacturing method of a thin film transistor array panel according to an exemplary embodiment. FIG. 7, FIG. 10, FIG. 13, FIG. 16, FIG. 19, FIG. 22, FIG. 25, FIG. 28, FIG. 31, FIG. 34, and FIG. 37 are cross-sectional views of the thin film transistor array panel taken along the line IV-IV of FIG. 1 in a manufacturing process according to a manufacturing method of a thin film transistor array panel according to an exemplary embodiment.

Figure 5:
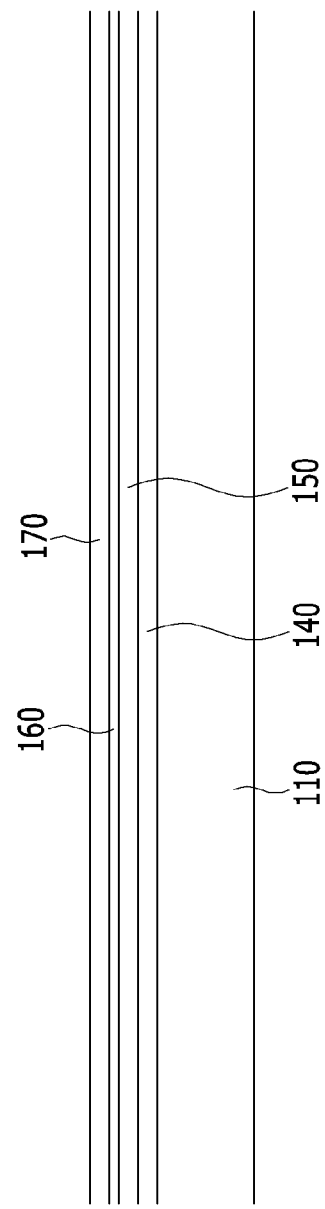
FIG. 5, FIG. 8, FIG. 11, FIG. 14, FIG. 17, FIG. 20, FIG. 23, FIG. 26, FIG. 29, FIG. 32, and FIG. 35 are cross-sectional views of the thin film transistor array panel taken along the line II-II of FIG. 1 in a manufacturing process according to a manufacturing method of a thin film transistor array panel according to an exemplary embodiment.
Figure 6:
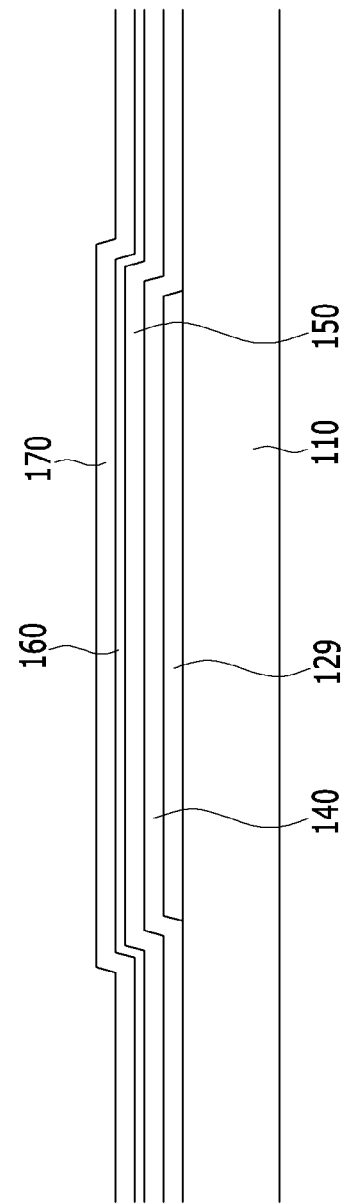
FIG. 6, FIG. 9, FIG. 12, FIG. 15, FIG. 18, FIG. 21, FIG. 24, FIG. 27, FIG. 30, FIG. 33, and FIG. 36 are cross-sectional views of the thin film transistor array panel taken along the line III-III of FIG. 1 in a manufacturing process according to a manufacturing method of a thin film transistor array panel according to an exemplary embodiment.
Figure 7:
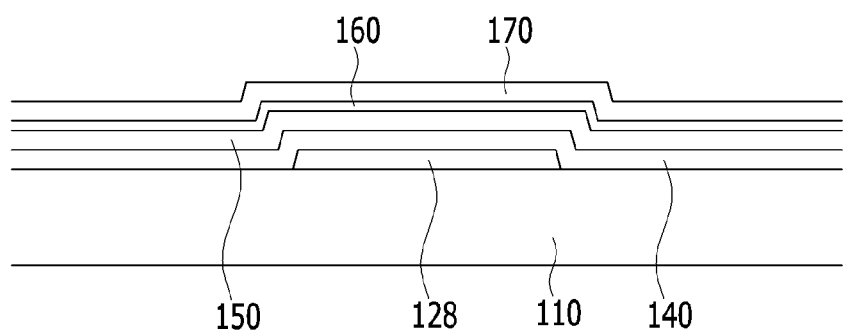
FIG. 7, FIG. 10, FIG. 13, FIG. 16, FIG. 19, FIG. 22, FIG. 25, FIG. 28, FIG. 31, FIG. 34, and FIG. 37 are cross-sectional views of the thin film transistor array panel taken along the line IV-IV of FIG. 1 in a manufacturing process according to a manufacturing method of a thin film transistor array panel according to an exemplary embodiment.

Firstly, referring to FIG. 5 to FIG. 7 along with FIG. 1, a gate conductor including a gate line 121 having a gate pad portion 129, a common voltage line 125, and a plurality of assistance data pad portions 128 is formed on an insulation substrate 110.

Next, a gate insulation layer 140 made of, for example, silicon nitride (SiNx), an intrinsic amorphous silicon (a-Si) layer 150 that is not doped with impurities, and an amorphous silicon (n+a-Si) layer 160 that is doped with impurities are formed on the gate lines 121 by a plasma enhanced chemical vapor deposition (PECVD) method. The intrinsic amorphous silicon layer 150 is made of, for example, hydrogenated amorphous silicon, and the amorphous silicon layer 160 that is doped with impurities is made of, for example, amorphous silicon that is doped with n-type impurities such as phosphor (P) with a high concentration, or of silicide. The amorphous silicon layer 160 doped with the impurities may be omitted. The data metal layer 170 is continuously deposited by sputtering on the amorphous silicon layer 160 doped with the impurities.

Figure 8:
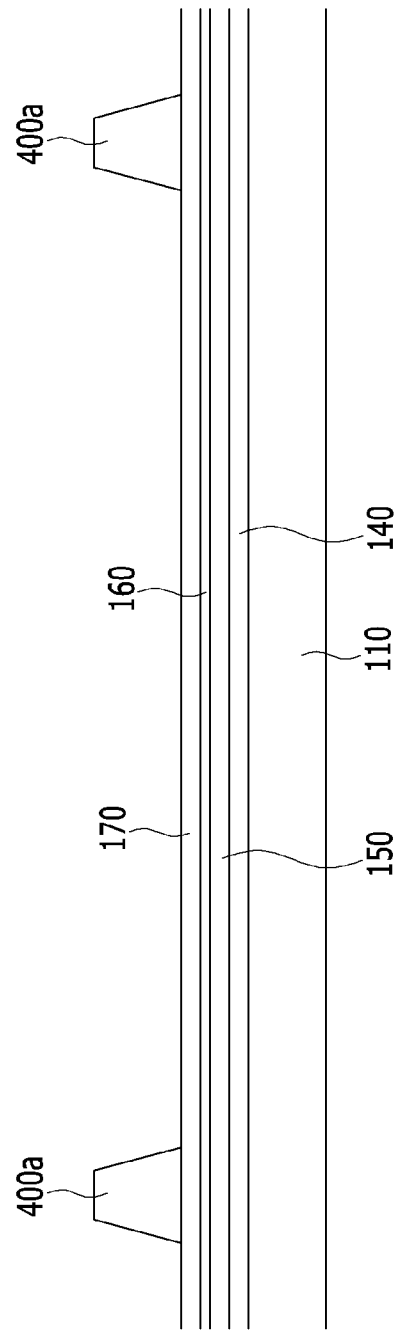
Figure 9:
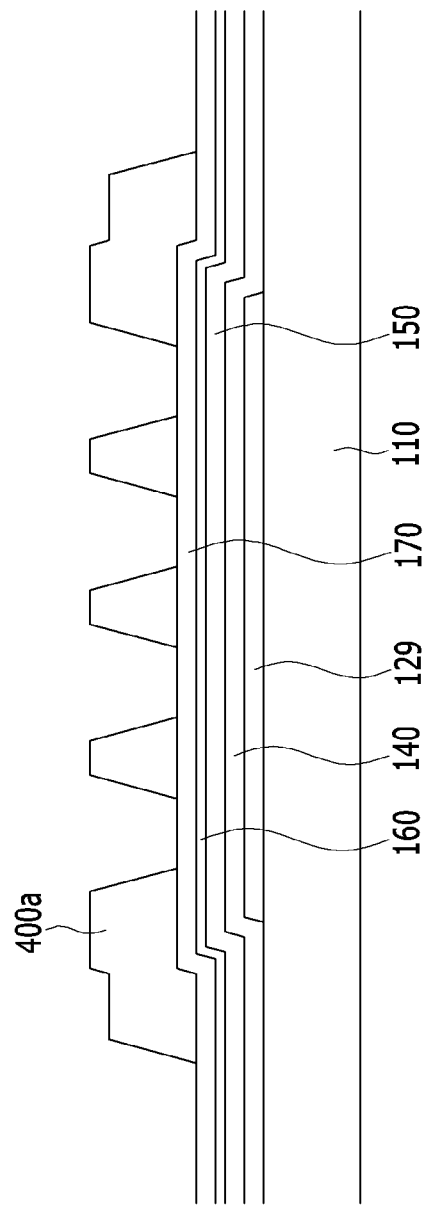
Figure 10:
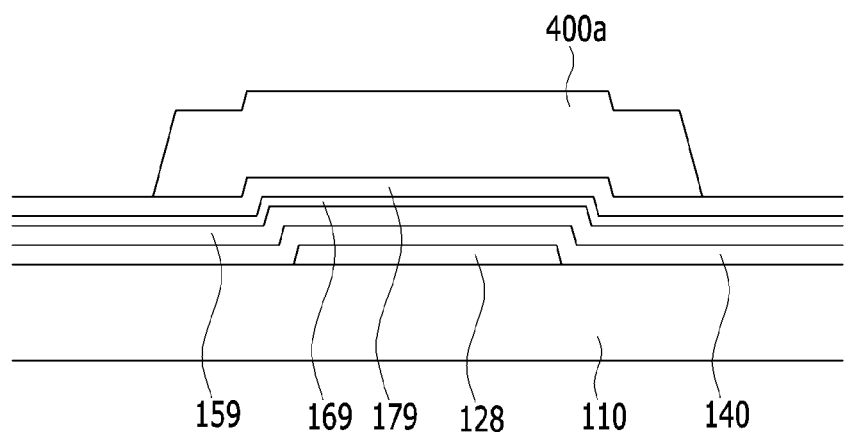

Next, as shown in FIG. 8 to FIG. 10, a photosensitive film is formed on the data metal layer 170 and is exposed and developed to form the first photosensitive film pattern 400a having different thicknesses. Although not shown, the photosensitive film pattern formed at a portion where the data conductor will be disposed may be thicker than the photosensitive film pattern formed at a portion where a channel of the thin film transistor will be disposed. The thickness difference depends on a process condition in an etching process to be described, and it is preferable that the thickness of the photosensitive film pattern corresponding to the channel is half or less of the thickness of the photosensitive film pattern corresponding to the data conductor. As described above, there may be various methods for forming the photosensitive films having different thicknesses according to position, and as an example of such a method, a transparent area, a light blocking area, and a semi-transparent area may be disposed in an exposure mask. In the semi-transparent area, a slit pattern, a lattice pattern, or a thin film that has middle transmittance or a middle thickness is provided. When the slit pattern is used, it is preferable that a width of the slit or an interval between slits is smaller than a resolution of a light that is used in the photolithography process. As another example thereof, a photosensitive film that can reflow may be used. That is, after a photosensitive film pattern that can reflow is formed by using a general mask that has only a transparent region and a light blocking region, the reflow process is performed, such that the photosensitive film is allowed to flow down into a region in which the photosensitive film does not remain, thus forming a thin part of photosensitive film.

Figure 11:
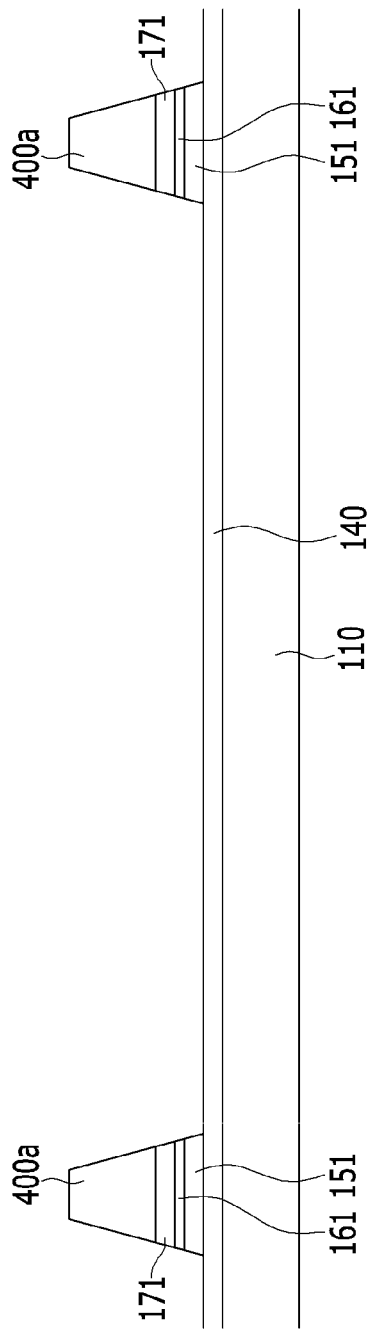
Figure 12:
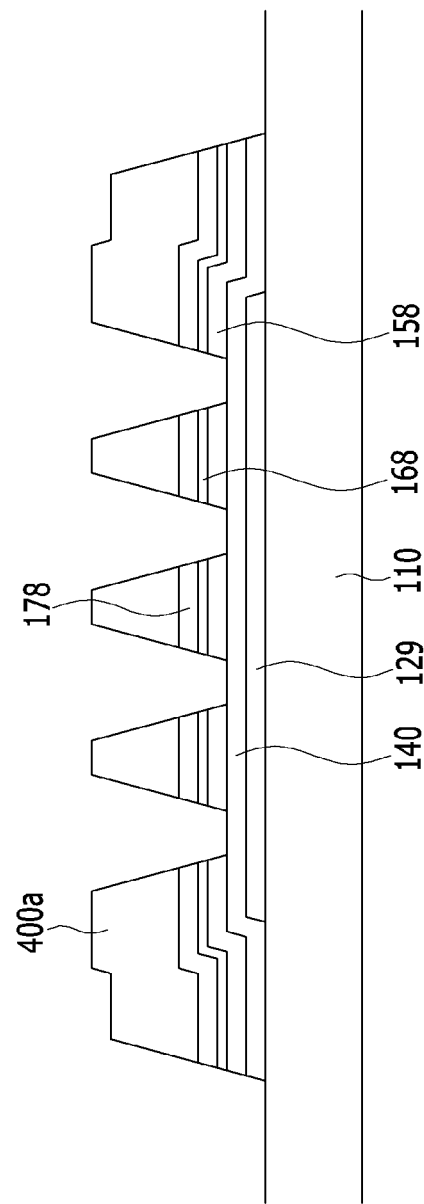
Figure 13:
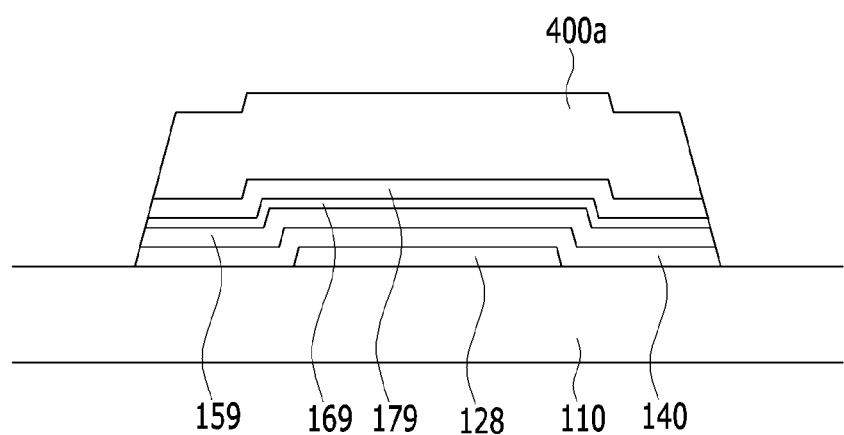

As shown in FIG. 11 to FIG. 13, by using the first photosensitive film pattern 400a as an etching mask, the data metal layer 170 is etched by wet etching, and next, the amorphous silicon layer 160 doped with the impurity and the intrinsic amorphous silicon layer 150 are etched by dry etching.

Figure 14:
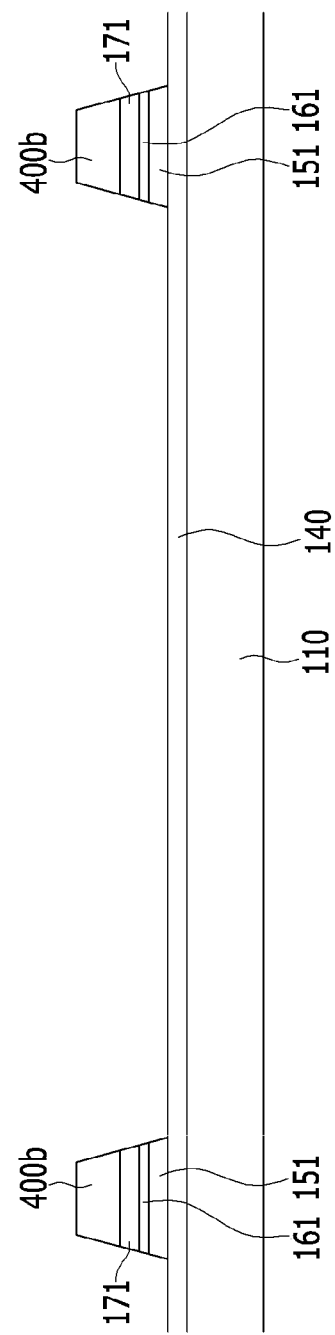
Figure 15:
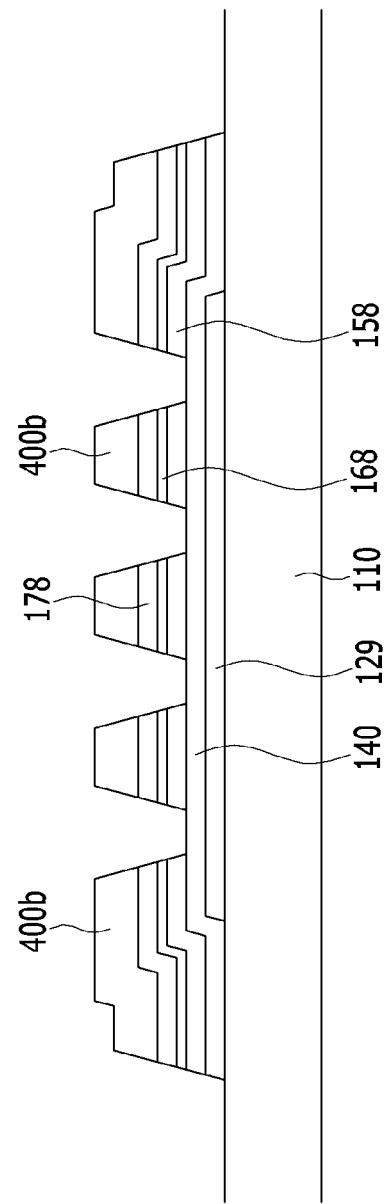
Figure 16:
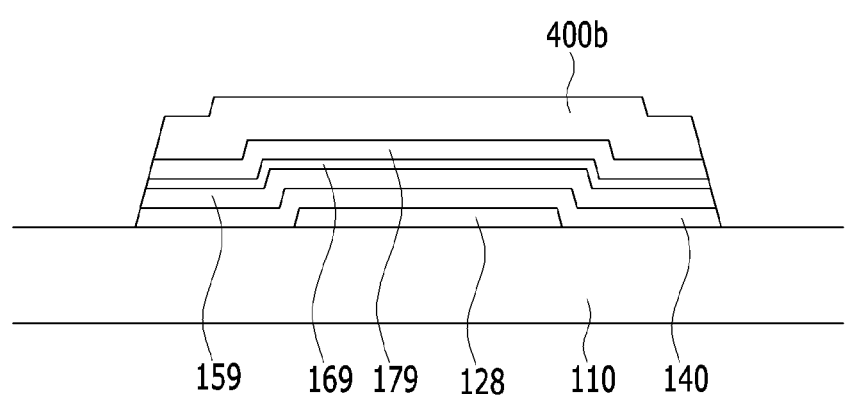

Next, as shown in FIG. 14 to FIG. 16, while the photosensitive film pattern corresponding to the channel of the thin film transistor and having the relatively thin thickness is removed by using an etch back process (not shown), the height of the photosensitive film pattern corresponding to the data conductor is decreased to form the second photosensitive film pattern 400b. Next, by using the second photosensitive film pattern 400b as the etching mask, the data metal layer 170 between the source electrode 173 and the drain electrode 175 is removed (not shown) to expose the amorphous silicon pattern doped with the impurity and corresponding to the channel, and then the amorphous silicon pattern doped with the impurity is etched by the dry etching to expose the protrusion 154 of the semiconductor as the channel, thereby completing the thin film transistor.

By this process, a data conductor including the data line 171, the data pad portion 179, the drain electrode 175, and the assistance gate pad portion 178 is completed, as well as the semiconductors 151, 154, 158, and 159, and the ohmic contact assistants 161, 168, and 169.

Additionally, first contact hole 181 (FIGS. 3 and 15) is formed at the first semiconductor 158, the first contact assistants 168, and the assistance gate pad portion 178, and the first contact hole 181 exposes the gate insulating layer 140 disposed thereunder.

Figure 17:
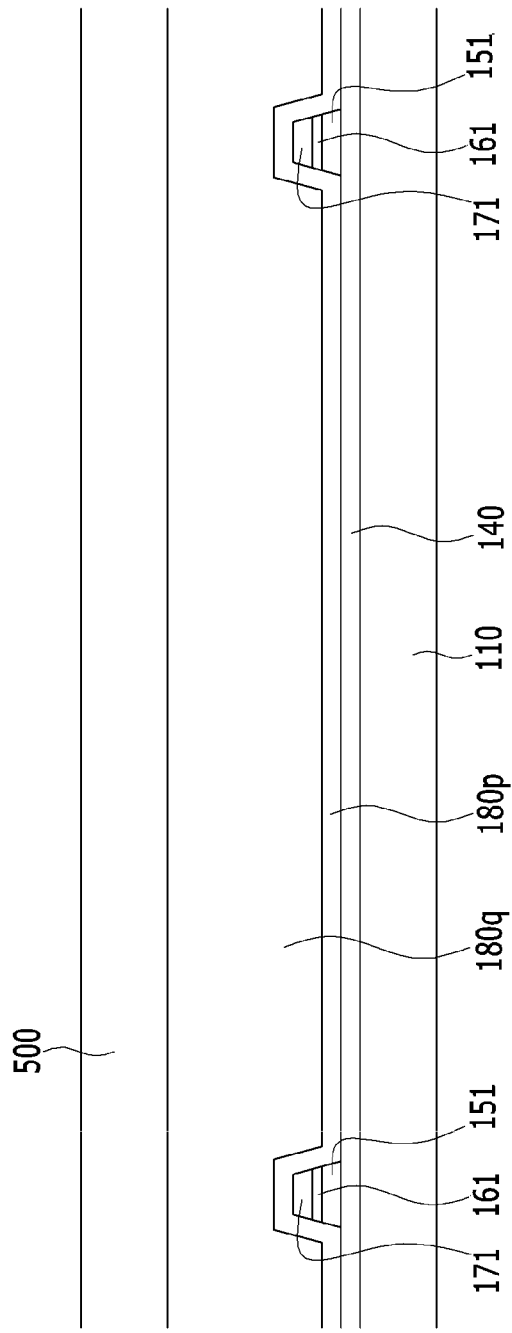
Figure 18:
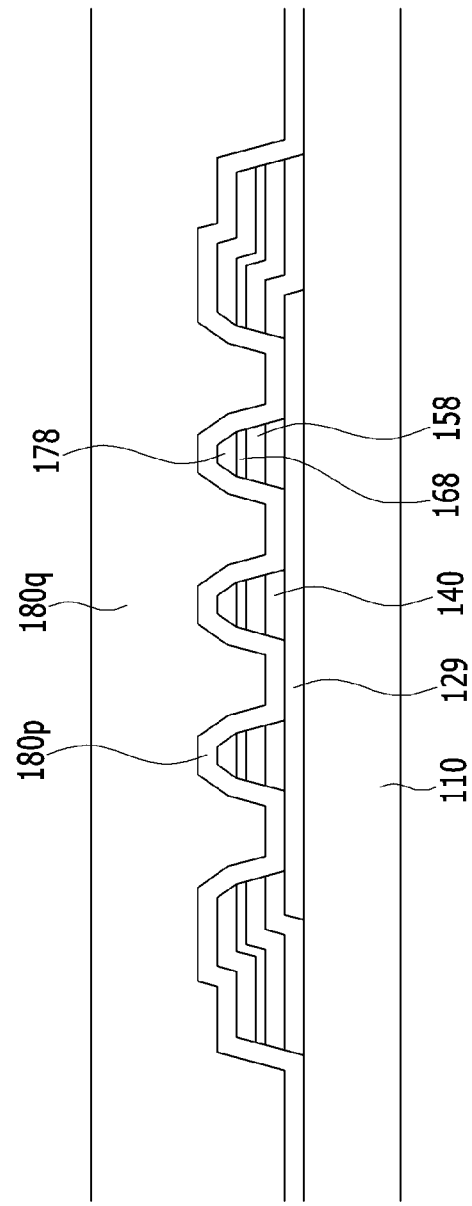
Figure 19:
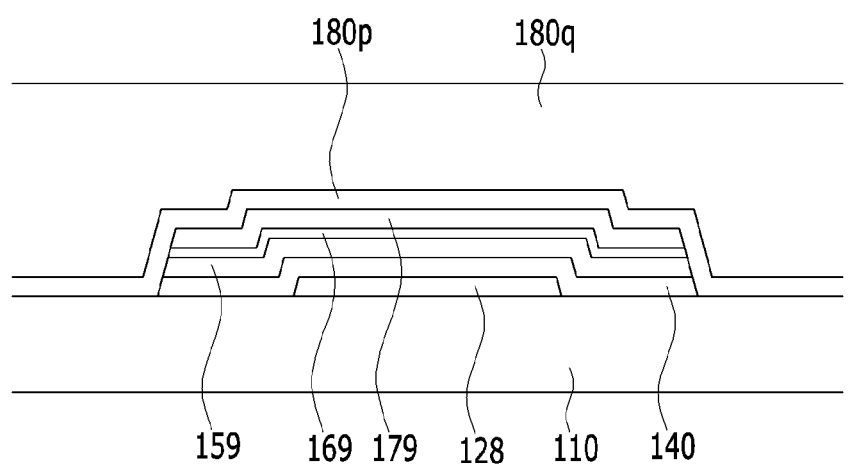

Next, as shown in FIG. 17 to FIG. 19, the first insulating layer 180p and the second insulating layer 180q are sequentially formed on the data conductor. The first insulating layer 180p may be made of, for example, an organic insulating material or an inorganic insulating material, the second insulating layer 180q may include, for example, the organic material, and the surface thereof may be almost flat. Next, the third photosensitive film pattern 500 (FIG. 17) is formed on the second insulating layer 180q. The third photosensitive film pattern 500 is not formed in the region where the gate pad portion 129 and the data pad portion 179 are disposed.

Figure 20:
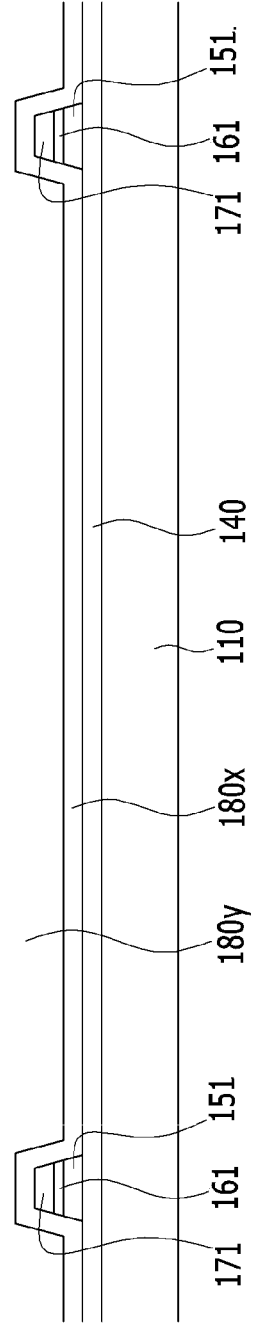
Figure 21:
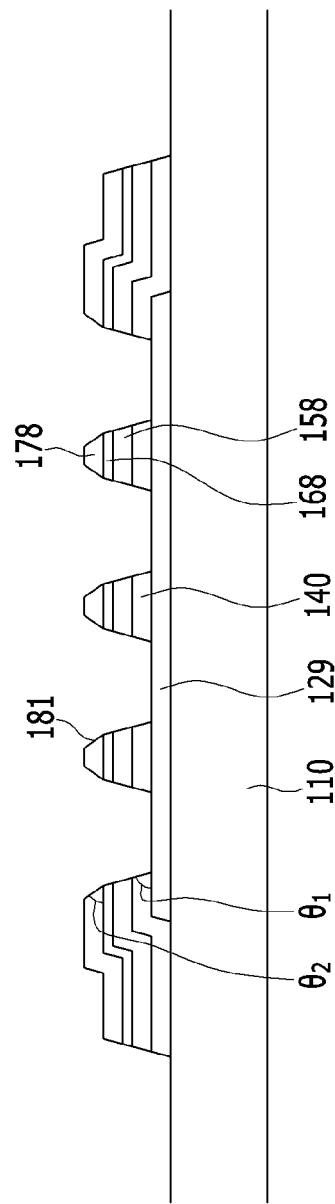
Figure 22:
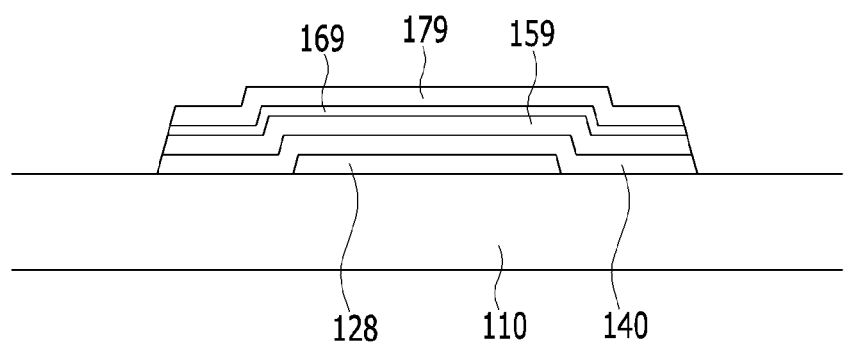

As shown in FIG. 20 to FIG. 22, by using the third photosensitive film pattern 500 as the etching mask, the second insulating layer 180q and the first insulating layer 180p are sequentially etched and are removed in the region where the gate pad portion 129 and the data pad portion 179 are disposed, and the first contact hole 181 (FIG. 21) exposing the gate pad portion 129 is completed.

Here, when etching the first insulating layer 180p, the gate insulating layer 140 (that is disposed in the region where the gate pad portion 129 and the data pad portion 179 are disposed and not covered by the data metal layer), the assistance gate pad portion 178, and the data pad portion 179 are etched together. Accordingly, the first contact hole 181 formed at the first semiconductor 158, the first contact assistants 168, and the assistance gate pad portion 178 are also formed at the gate insulating layer 140. By this process, the gate pad portion 129 is exposed and the first contact hole 181 formed at the gate insulating layer 140, the first semiconductor 158, the first contact assistants 168, and the assistance gate pad portion 178 is completed. As described above, near the first contact hole 181 formed at the gate insulating layer 140, the first semiconductor 158, and the first contact assistants 168, the first taper angle θ1 between the gate insulating layer 140, the first semiconductor 158, and the first contact assistants 168 and the substrate 110 surface may be larger than the second taper angle θ2 between the assistance gate pad portion 178 and the substrate 110 surface near the first contact hole 181 formed at the assistance gate pad portion 178.

Figure 23:
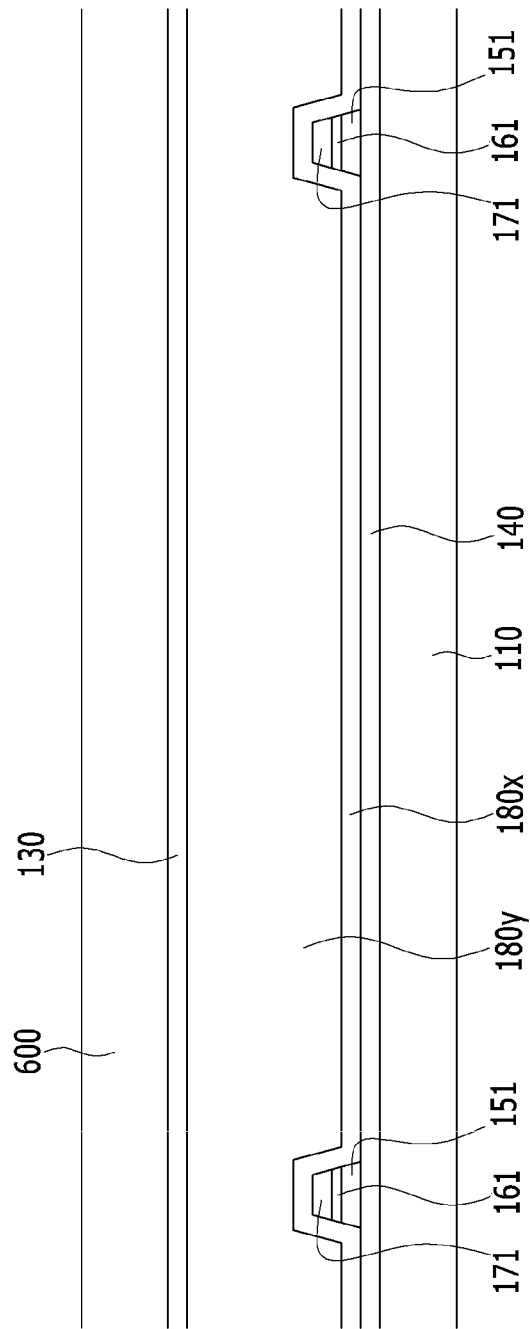
Figure 24:
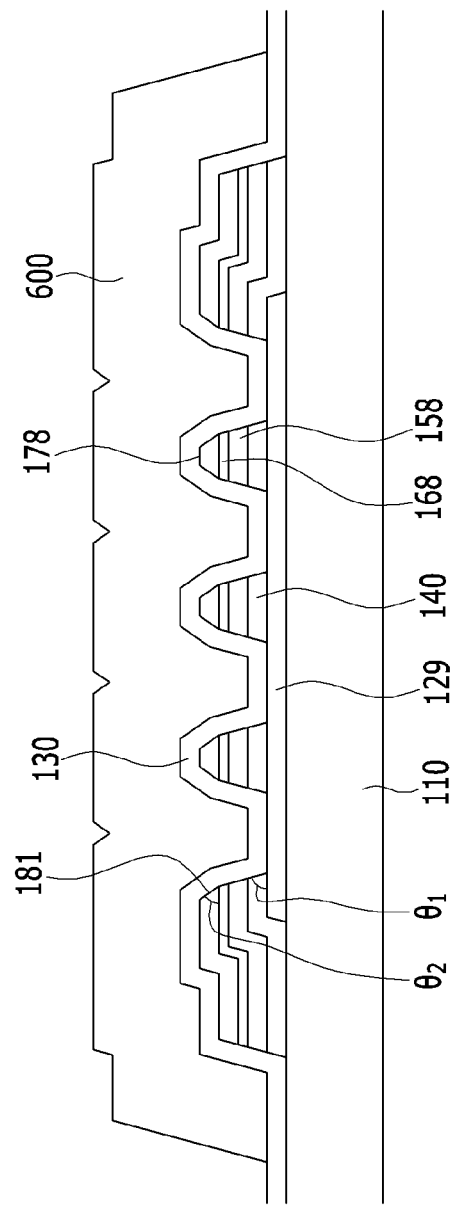
Figure 25:
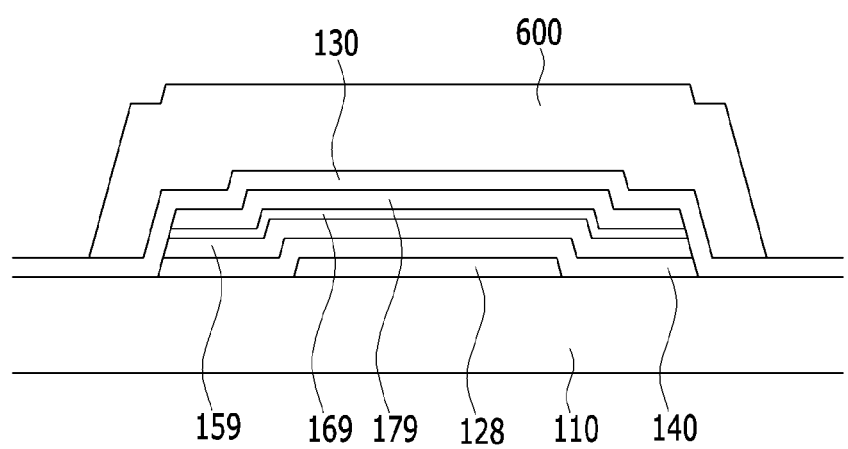

Next, as shown in FIG. 23 to FIG. 25, the first electrode layer 130 forming the common electrode 131 disposed as the lower electrode among the field generating electrodes, and the fourth photosensitive film pattern 600 are formed. The fourth photosensitive film pattern 600 is disposed at a position at which the common electrode 131 will be formed, and also at a region where the gate pad portion 129 and the data pad portion 179 are formed. The fourth photosensitive film pattern 600 covers and protects the gate pad portion 129 and the data pad portion 179.

Figure 26:
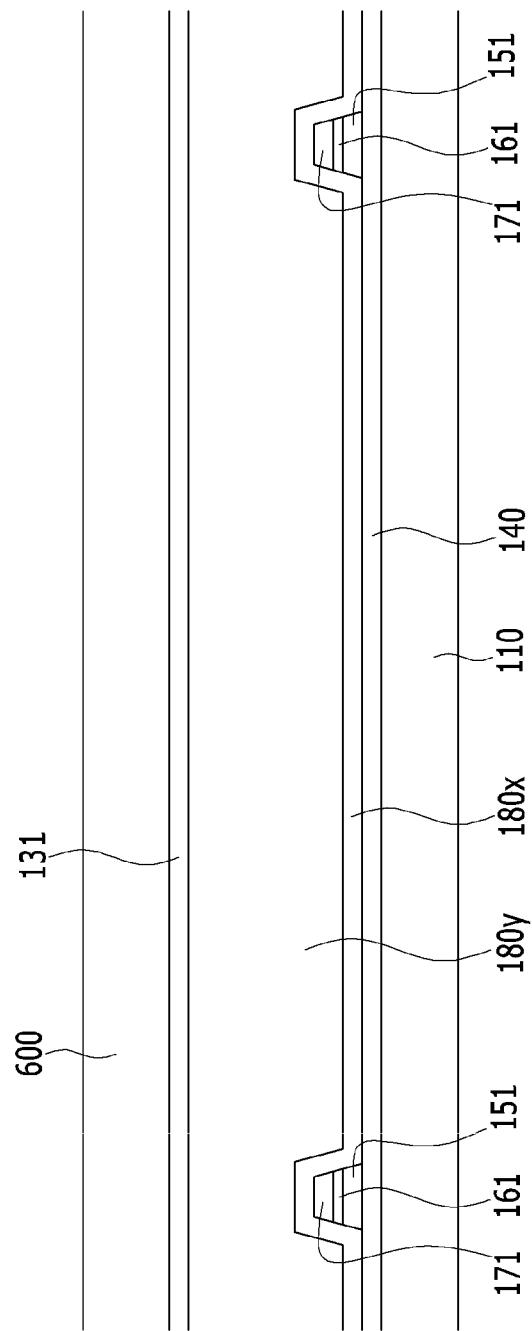
Figure 27:
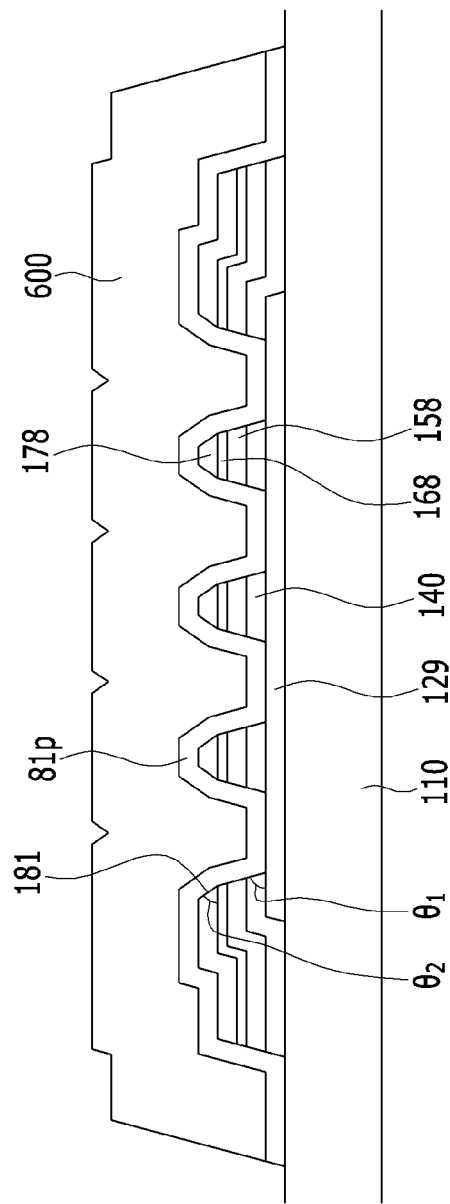
Figure 28:
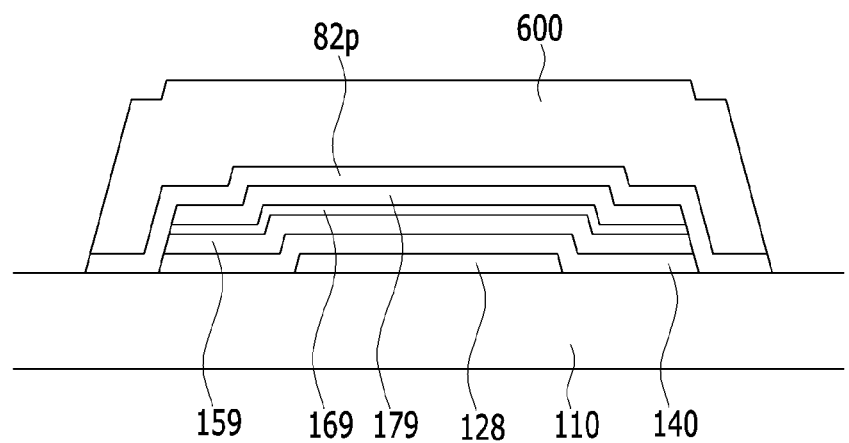

Next, as shown in FIG. 26 to FIG. 28, by using the fourth photosensitive film pattern 600 as the etching mask, the first electrode layer 130 is etched to complete the common electrode 131 and the lower layer 81p of the first connecting member and the lower layer 82p of the second connecting member 82.

Figure 29:
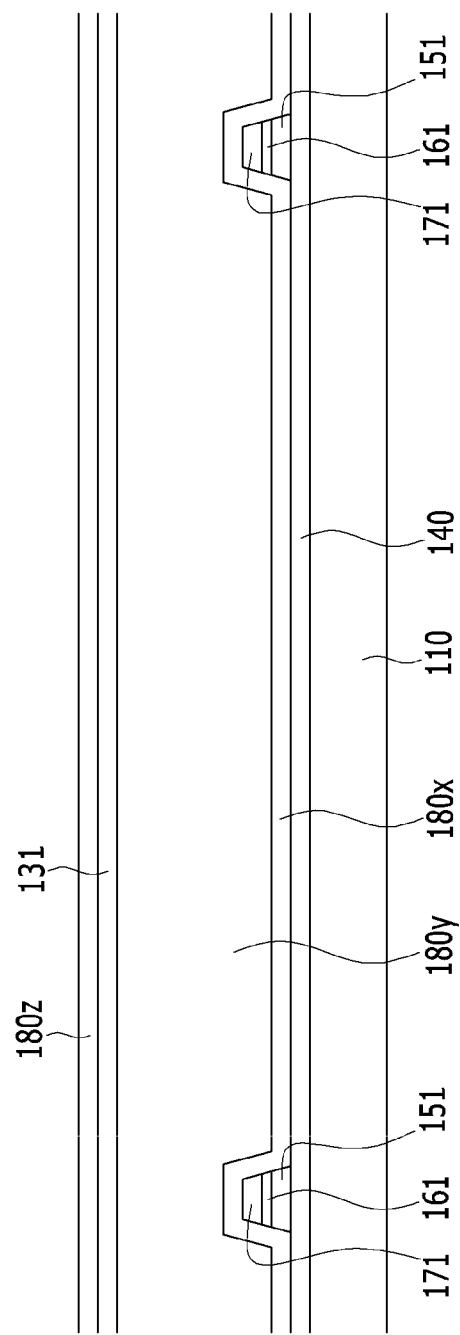
Figure 30:
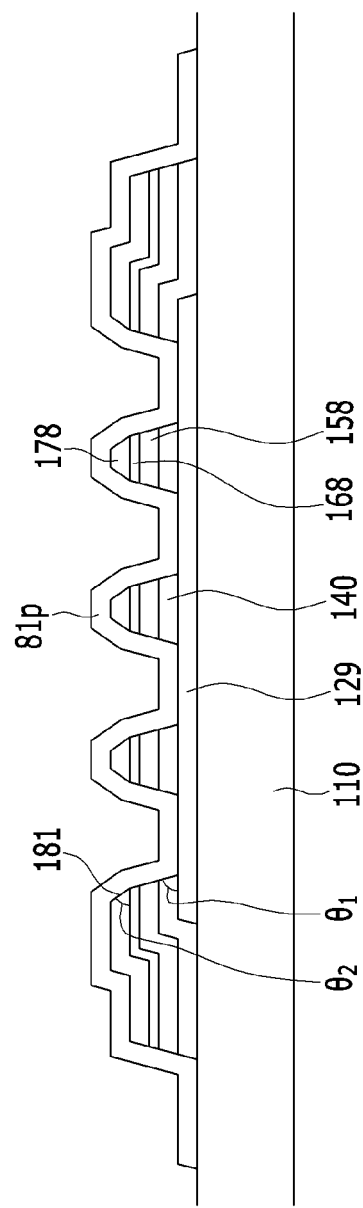
Figure 31:
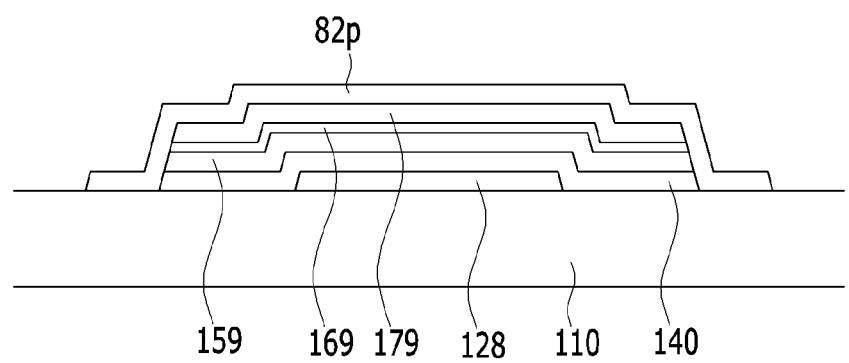

Next, with a similar method to that of FIG. 17 to FIG. 22, an insulating layer forming the third passivation layer 180z is deposited, and a photosensitive film pattern that is not formed at the region where the gate pad portion 129 and the data pad portion 179 are disposed is formed on the deposited insulating layer. At this time, the same photomask used when forming the third photosensitive film pattern 500 may be used. Next, the deposited insulating layer is etched by using the photosensitive film pattern as the etching mask, as shown in FIG. 29 to FIG. 31, to form the third passivation layer 180z that is disposed in the display area and is removed in the region where the gate pad portion 129 and the data pad portion 179 are disposed.

Figure 32:
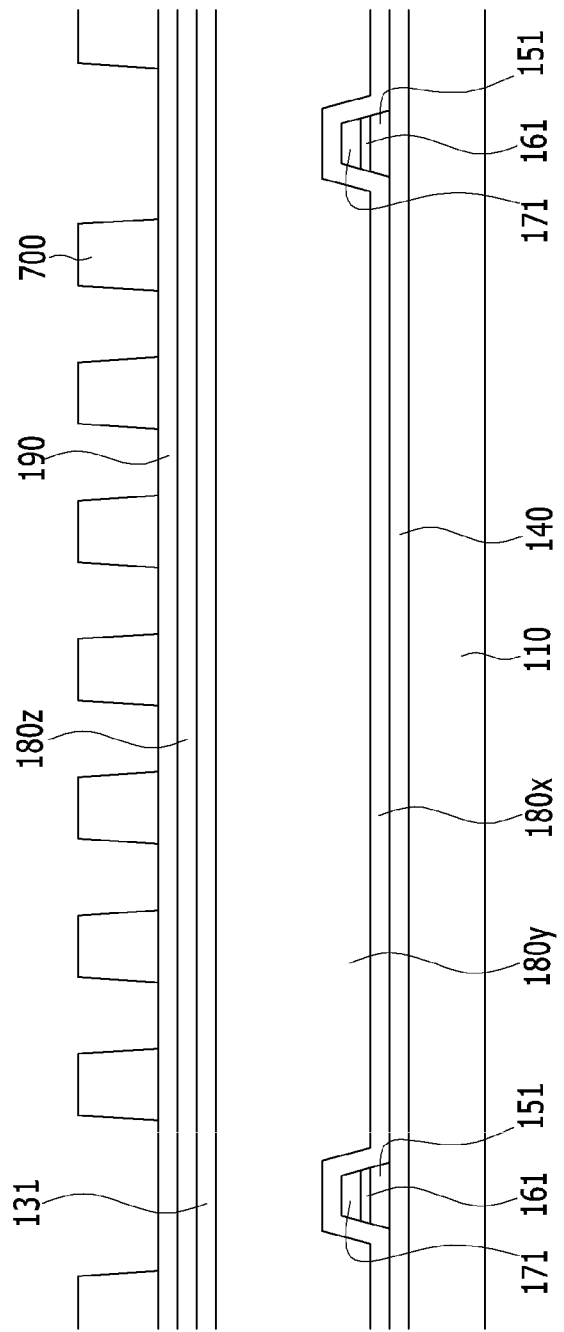
Figure 33:
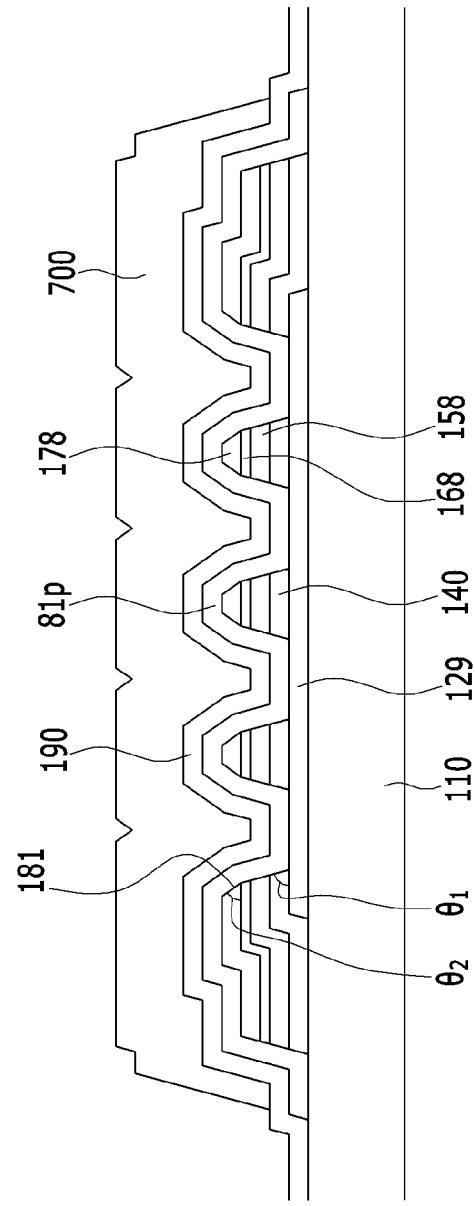
Figure 34:
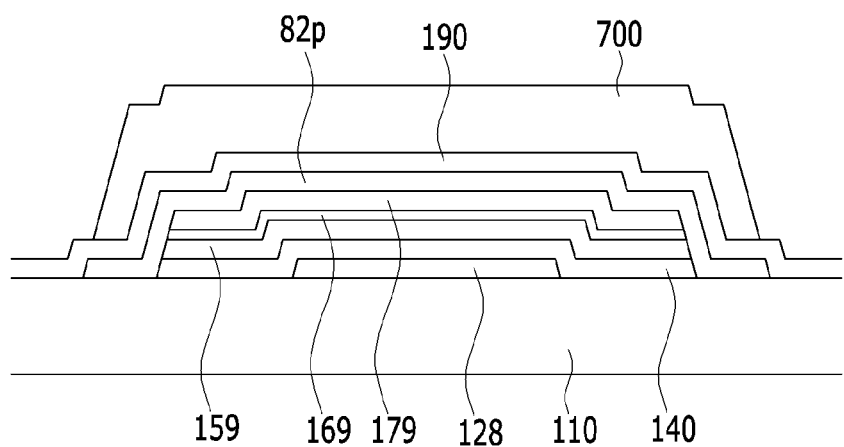

Next, as shown in FIG. 32 to FIG. 34, the second electrode layer 190 forming the pixel electrode 191 disposed as the upper electrode among the field generating electrodes is deposited, and the fifth photosensitive film pattern 700 is formed thereon. The fifth photosensitive film pattern 700 is disposed at the position where the pixel electrode 191 will be formed and at the region where the gate pad portion 129 and the data pad portion 179 are formed. The fifth photosensitive film pattern 700 covers and protects the gate pad portion 129 and the data pad portion 179.

Figure 35:
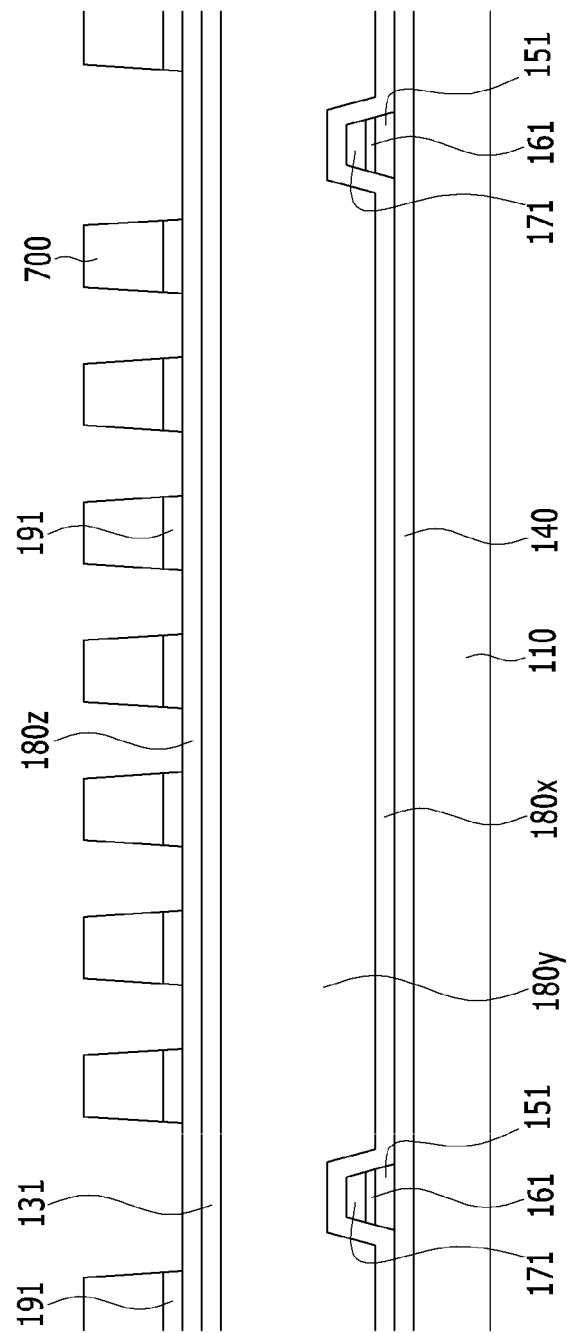
Figure 36:
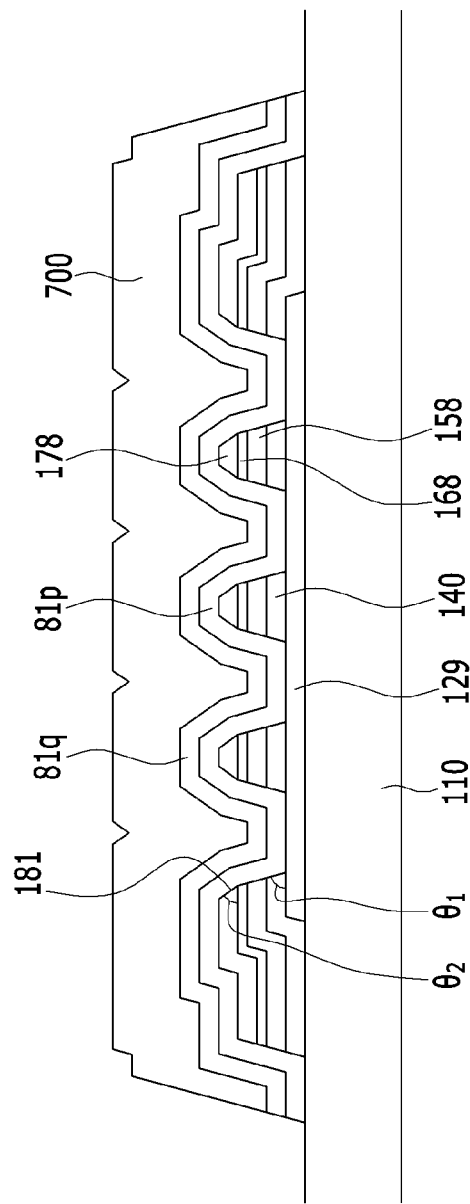
Figure 37:
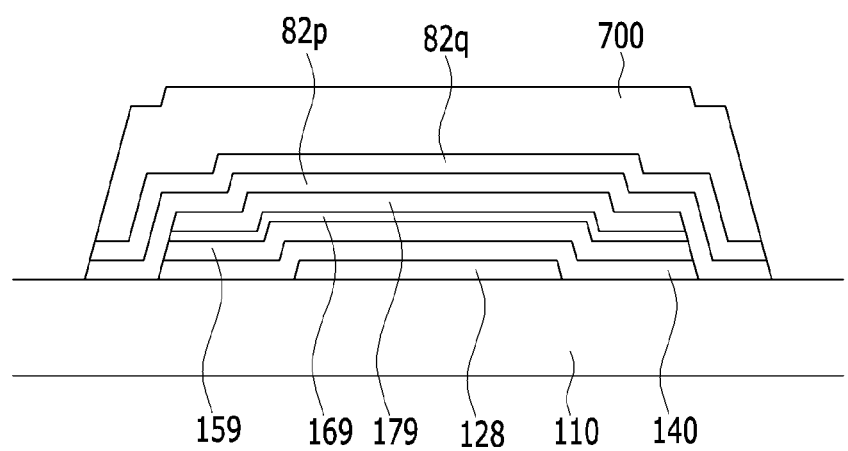

Next, as shown in FIG. 35 to FIG. 37, by using the fifth photosensitive film pattern 700 as the etching mask, the second electrode layer 190 is etched to complete the pixel electrode 191, the upper layer 81q of the first connecting member, and the upper layer 82q of the second connecting member.

In this way, in the manufacturing method of the thin film transistor array panel according to an exemplary embodiment, the photosensitive film pattern exposing the pad portion is formed when forming the passivation layer, and the photosensitive film pattern covering and protecting the pad portion is formed when forming the field generating electrode, thereby the passivation layer is not disposed in the pad portion, and simultaneously, the connecting member with the same layer as the field generating electrode layer may be formed. Also, the same number of photomasks as used in the conventional manufacturing process are used, such that the cost of the manufacturing process is not increased.

In the case of the manufacturing method of the thin film transistor array panel according to the present exemplary embodiment, one of two field generating electrodes 131 and 191 overlapping each other has the planar shape and the other has the branch shape, however the present disclosure may be applied to a thin film transistor array panel of any shape in which one display panel has two field generating electrodes.

While the disclosure describes what is presently considered to be practical exemplary embodiments, it is to be understood that the disclosure is not limited to the disclosed embodiments, but, on the contrary, is intended to cover various modifications and equivalent arrangements included within the spirit and scope of the disclosure including the appended claims.

What is claimed is:

1. A thin film transistor array panel comprising:
an insulation substrate;
a gate line and a gate pad portion disposed on the insulation substrate;
a gate insulating layer disposed on and in contact with the gate line and the gate pad portion;
a semiconductor layer disposed on and in contact with the gate insulting layer over the gate pad portion;
a data line and a data pad portion disposed on the gate insulating layer;
a gate assistance pad portion disposed on the semiconductor layer opposite the gate insulting layer at a position corresponding to the gate pad portion;
a first insulating layer disposed on the data line;
a first field generating electrode disposed on the first insulating layer;
a second insulating layer disposed on the first field generating electrode; and
a second field generating electrode disposed on the second insulating layer,
wherein the assistance gate pad portion includes a hole and the semiconductor layer and gate insulating layer include a contact hole exposing an upper surface of the gate pad portion, an edge surface of the gate insulating layer, an edge surface of the semiconductor layer and an edge surface of the gate assistance pad portion, wherein the edge surface of the gate insulating layer is aligned with the edge surface of the semiconductor layer and together form a first taper angle with the insulting substrate, and the edge surface of the gate assistance pad portion forms a second taper angle with the insulating substrate that is smaller than the first taper angle,
wherein a connecting member is made with a first layer that is the same layer as the first field generating electrode, and a second layer contacting the first layer, the second layer is the same layer as the second field generating electrode, and the first layer is in contact with the upper surface of the gate pad portion, the edge surface of the gate insulating layer, the edge surface of the semiconductor layer and the edge surface of the gate assistance pad portion,
wherein the first insulating layer and the second insulating layer do not overlap the gate pad portion and the data pad portion,
wherein the gate insulating layer is the only insulating layer disposed between the gate pad portion and the gate assistance pad portion and the first insulating layer and the second insulating layer are not disposed between the gate pad portion and the gate assistance pad portion.

2. The thin film transistor array panel of claim 1, wherein the assistance gate pad portion is made of the same layer as the data line.

3. The thin film transistor array panel of claim 1, wherein the assistance gate pad portion includes at least one additional hole and the gate insulating layer includes at least one additional contact hole.

4. The thin film transistor array panel of claim 3, wherein a shape of the contact hole in a plan view is polygonal, circular, or oval.

5. The thin film transistor array panel of claim 4, further comprising
an assistance data pad portion disposed at a position corresponding to the data pad portion.

6. The thin film transistor array panel of claim 5, wherein the gate insulating layer is disposed between the data pad portion and the assistance data pad portion.

7. The thin film transistor array panel of claim 6, wherein the assistance data pad portion and the gate line are made with a same material.

8. The thin film transistor array panel of claim 5, wherein one of the first field generating electrode and the second field generating electrode has a planar shape, and the other includes a branch electrode.

9. The thin film transistor array panel of claim 8, wherein the first insulating layer includes an organic insulator, and a surface thereof is flat.

10. The thin film transistor array panel of claim 1, wherein the assistance gate pad portion is made with the same layer as the data line.

11. The thin film transistor array panel of claim 10, wherein the assistance gate pad portion includes at least one additional hole and the gate insulating layer includes at least one additional contact hole.

12. The thin film transistor array panel of claim 11, wherein the shape of the contact hole in a plan view is polygonal, circular, or oval.

13. The thin film transistor array panel of claim 1, further comprising
an assistance data pad portion disposed at a position corresponding to the data pad portion.

14. The thin film transistor array panel of claim 13, wherein the gate insulating layer is disposed between the data pad portion and the assistance data pad portion.

15. The thin film transistor array panel of claim 14, wherein the assistance data pad portion is made with the same layer as the gate line.

16. The thin film transistor array panel of claim 1, wherein one of the first field generating electrode and the second field generating electrode has a planar shape, and the other includes a branch electrode.

17. The thin film transistor array panel of claim 1, wherein the first insulating layer includes an organic insulator, and a surface thereof is flat.

18. The thin film transistor array panel of claim 1, wherein the shape of the contact hole in a plan view is polygonal, circular, or oval.

* * * * *